United States Patent
Anazawa

[19]

[11] Patent Number: 6,032,082
[45] Date of Patent: Feb. 29, 2000

[54] METHOD AND CAD SYSTEM FOR CALCULATING SEMICONDUCTOR CIRCUIT RESISTANCE

[75] Inventor: Tetsuya Anazawa, Kawasaki, Japan

[73] Assignee: Fujitsu Limited, Kawasaki, Japan

[21] Appl. No.: 08/725,952

[22] Filed: Oct. 7, 1996

[30] Foreign Application Priority Data

Mar. 1, 1996 [JP] Japan ..................................... 8-044700

[51] Int. Cl.[7] .................................................. G06F 19/00
[52] U.S. Cl. ........................ 700/97; 700/121; 395/500.02
[58] Field of Search .................... 364/474.24, 468.03,
364/468.28, 488–491, 578; 395/500, 500.02,
500.05, 500.13–500.16, 500.17, 500.03,
500.12, 500.2, 500.35; 438/17; 700/182,
97, 121, 98

[56] References Cited

U.S. PATENT DOCUMENTS

| 5,404,309 | 4/1995 | Yamamoto et al. | 364/489 |
| 5,551,014 | 8/1996 | Yoshida et al. | 395/500 |
| 5,598,348 | 1/1997 | Rusu et al. | 364/491 |
| 5,872,952 | 2/1999 | Tuan et al. | 395/500 |

*Primary Examiner*—William Grant
*Assistant Examiner*—Steven R. Garland
*Attorney, Agent, or Firm*—Staas & Halsey LLP

[57] ABSTRACT

A CAD system is used to design a semiconductor circuit having wiring layers and contact holes that connect wires formed on the wiring layers to each other. The CAD system has an individual resistance calculation block for calculating and storing the resistances of the contact hole and the wires which are connected to the contact hole to form a wiring path. A summation block sums up the calculated resistances, to provide the resistance of the wiring path. An individual resistance calculation block calculates and stores, as the resistance of the contact hole, a first resistance in contact with a first wiring layer, a second resistance in contact with a second wiring layer, an interlayer resistance, and a combination of them. The summation block calculates the resistance of the wiring path using, as the resistance of the contact hole, the first resistance when the wires of the wiring path are on the first wiring layer, the second resistance when the wires of the wiring path are on the second wiring layer, and the sum of half of the first resistance, half of the second resistance, and the interlayer resistance when the wires of the wiring path are on the first and second wiring layers.

19 Claims, 8 Drawing Sheets

A → B    R1 + Rhu + R2

A → D    R1 + Rhu + Rcn + Rhℓ + R4

A → B    R1 + Rhua + Rhub + R2

A → D    R1 + Rhua + Rcu + Rcn + Rcℓ + Rhℓd + R4

P → Q     Rp + Rh + Rq

P → S     Rp + Rh + Rs

METHOD AND CAD SYSTEM FOR CALCULATING SEMICONDUCTOR CIRCUIT RESISTANCE

BACKGROUND OF THE INVENTION

The present invention relates to a method of calculating the resistance of a wiring path of a semiconductor circuit and a CAD (computer aided design) system for designing a semiconductor circuit, having a function of calculating the resistance of each wiring path of the semiconductor circuit. In particular, the present invention relates to a method of accurately calculating the resistance of a wiring path that involves wires formed on different wiring layers and a contact hole for connecting the wires to each other.

CAD systems are widely used to design semiconductor circuits. For example, a logic circuit CAD system has a function design block for designing functions of a semiconductor circuit, an automatic logic design block for automatically designing logic circuits according to the designed functions, an automatic layout block for automatically laying out logic elements and signal and power source lines connected to the logic elements, and a test block for simulating the designed circuit. These blocks are systematically operated. The designed circuit is simulated to see whether or not the resistance of each wiring path has a required value. For this purpose, the CAD system has a block for calculating the resistance of each wiring path. The CAD system is constructed in a computer, and the functions thereof are realized by software.

FIG. 6 is a diagram illustrating wiring paths whose resistances are going to be calculated. Metal wires 111, 112, 113, and 114 are formed on an upper wiring layer, metal wires 121 and 122 are formed on a lower wiring layer, and contact holes 131 and 132 are formed to connect the wires to one another. The wires have ends A, B, C, D and E.

FIG. 7A is a section taken along a line VII—VII between ends A and B of FIG. 6, and FIG. 7B is a diagram of a model used by a prior art CAD system to calculate the resistance of a wiring path.

In FIG. 7A, the upper wires 111, 112, and 113 are orthogonal to the lower wires 121 and 122 and are connected thereto through the contact holes 131 and 132. When calculating the resistance of a contact hole, the prior art system employs the model of FIG. 7B. The prior art system considers the contact hole to have a single resistance Rh, and the wires to have resistances Rp, Rq, Rr, and Rs, respectively. The resistance of a wiring path from P to Q is Rp+Rh+Rq, and the resistance of a wiring path from P to S is Rp+Rh+Rs. Namely, the prior art considers that these wiring paths have the same resistance.

FIG. 8 is a diagram of a model showing the resistances of the elements of FIG. 7B. The upper wires 111, 112, 113, and 114 have resistances R1ca, Rcacb, Rcb2, and Rcb5, respectively. The lower wires 121 and 122 have resistances Rca3 and Rcb4, respectively. The contact holes 131 and 132 have resistances Rh1 and Rh2, respectively. These elements are connected to one another as shown in FIG. 8. The resistance of each wiring path is calculated as follows:

```
A to B = R1ca + Rh1 + Rcacb + Rh2 + Rcb2
A to C = R1ca + Rh1 + Rca3
A to D = R1ca + Rh1 + Rcacb + Rh2 + Rcb4
A to E = R1ca + Rh1 + Rcacb + Rh2 + Rcb5
```

The resistances of the other wiring paths are calculated similarly.

The prior art resistance calculation illustrated by FIGS. 7A, 7B and 8 considers a contact hole to have a fixed resistance when calculating the resistance of a wiring path that involves the contact hole and wires connected thereto, without regard to whether the wires are on an upper wiring layer, a lower wiring layer, or both. A contact hole consists of an upper contact layer, a lower contact layer, and an intermediate contact layer between the upper and lower contact layers. When wires which form a wiring path with the contact hole, are both on the upper wiring layer, the actual resistance of the contact hole in the wiring path is close to the resistance of the upper contact layer. When the wires are both on the lower wiring layer, the actual resistance of the contact hole in the wiring path is close to the resistance of the lower contact layer. When the wires of the wiring path are on the upper and lower wiring layers, respectively, the actual resistance of the contact hole in the wiring path is close to the total resistance of the contact hole. As a result, the prior art resistance calculation method will be correct only when wires which form a wiring path with the contact hole, are on the upper and lower wiring layers, respectively. If the wires are both on the upper layer or the lower layer, the prior art resistance calculation method will cause a large error in calculating the resistance of the wiring path. Usually, the upper, intermediate, and lower contact layers of a contact hole have different resistances. If the difference between them is very large, the prior art resistance calculation method will cause a large error in calculating the resistance of a wiring path. This error increases as the number of contact holes involved in a wiring path increases.

There is a need for a CAD system which designs a semiconductor circuit that operates substantially as simulated, to eliminate the production of prototypes. To meet this requirement, it is necessary to improve the accuracy of simulations as well as the accuracy of wiring path resistance calculation.

SUMMARY OF THE INVENTION

An object of the present invention is to improve the accuracy of wiring path resistance calculation for a semiconductor circuit.

To achieve the above object, the present invention is directed to a method of calculating the resistance of a selected wiring path in a semiconductor circuit having wiring layers and contact holes that connect wires formed on the wiring layer to each other. The method includes dividing a resistance of a contact hole into a first resistance in contact with a first wiring layer, a second resistance in contact with the second wiring layer, and an interlayer resistance. The method further includes calculating a resistance of a selected wiring path using, as the resistance of the contact hole, the first resistance when the wires of the selected wiring path are on the first wiring layer, the second resistance when the wires of the selected wiring path are on the second wiring layer, and the sum of the first, second and interlayer resistances when the wires of the selected wiring path are on the first and second wiring layers.

The above method of the present invention is implemented by a CAD system which includes a first means for calculating and storing a resistance of each contact hole and wire, which are connected to form a wiring path. A second means sums up the calculated resistances and outputs the resistance of the wiring path. The first means calculates and stores a first resistance in contact with the first wiring layer, a second resistance in contact with the second wiring layer, an interlayer resistance, and a combination of the first, second, and third interlayer resistances. The second means calculates the resistance of the wiring path using, as the resistance of the contact hole, the first resistance when the wires of the wiring path are on the first wiring layer, the second resistance when the wires of the wiring path are on the second wiring layer, and the sum of the first, second and third interlayer resistances when the wires of the wiring path are on the first and second wiring layers.

Another aspect of the present invention is directed to an improvement of the above-described method in which the calculating step further includes calculating a modified resistance of each wire that is on the first wiring layer and is connected to a contact hole, to be the sum of its own resistance and half of the first resistance of the contact hole. A modified resistance of each wire that is on the second wiring layer and is connected to a contact hole is calculated to be the sum of its own resistance and half of the second resistance of the contact hole. A modified resistance of each contact hole is calculated to be the sum of the interlayer resistance, half of the first resistance and half of the second resistance. The resistance of the wiring path is calculated by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

The above-described improvement of the method of the present invention is implemented in the above-mentioned CAD system such that the first means calculates and stores a modified resistance of each wire that is on the first wiring layer and is connected to a contact hole to be the sum of the resistance of the wire and half of the first resistance of the contact hole. The first means also calculates and stores a modified resistance of each wire that is on the second wiring layer and is connected to a contact hole to be the sum of its own resistance and half of the second resistance of the contact hole. The first means also calculates and stores a modified resistance of each contact hole to be the sum of the interlayer resistance, half of the first resistance and half of the second resistance. The second means calculates the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

The present invention is capable of accurately calculating the resistance of a wiring path of a semiconductor circuit and of improving the reliability of simulations carried out by a CAD system.

These together with other objects and advantages, which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1A:
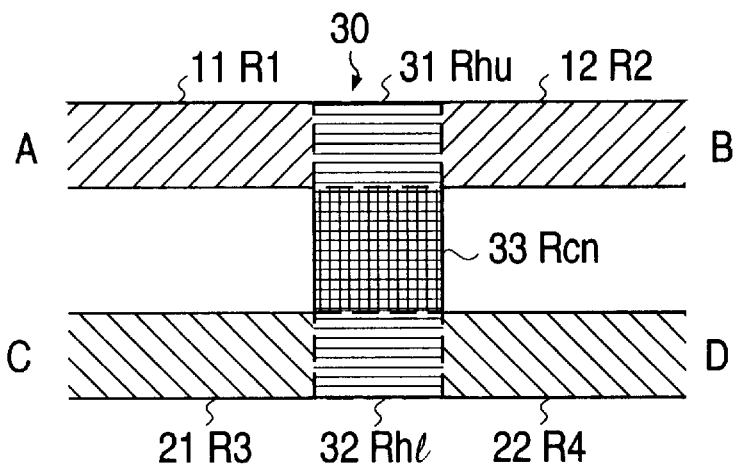
FIGS. 1A and 1B are diagrams illustrating the principle of resistance calculation in accordance with the present invention.
Figure 1B:
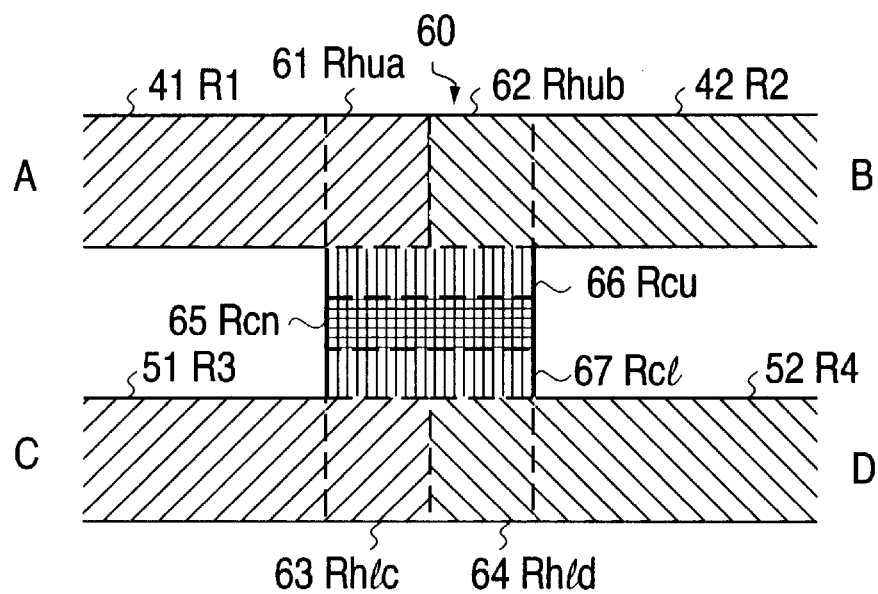

FIG. 1A is a diagram illustrating the principle of a first aspect of the present invention, and FIG. 1B is a diagram illustrating the principle of a second aspect of the present invention.

In general, the method of the present invention is directed to calculating the resistance of a wiring path in a semiconductor circuit, by using a computer. The method includes assigning at least first, second and third resistance values corresponding to at least first, second and third portions of a contact hole. The method also includes a step of calculating a resistance of a selected wiring path, using as a resistance value for the contact hole, the first resistance value, the second resistance value or a combination of the first, second and third resistance values based on the route of the wiring path through the contact hole. For example, FIG. 1A illustrates an embodiment in which the contact hole is divided into three portions which are assigned first, second and third resistance values, while FIG. 1B discloses an embodiment in which the contact hole is divided into more than three portions which are assigned corresponding resistance values.

In the first aspect of the present invention illustrated in FIG. 1A, the resistance of a contact hole 30 is divided into a first resistance Rhu of a first contact layer 31 that is in contact with a first wiring layer, a second resistance Rhl of a second contact layer 32 that is in contact with a second wiring layer, and an interlayer resistance Rcn of an intermediate contact layer between the contact layers 31 and 32. When calculating the resistance of a wiring path that involves wires 11 and 12 formed on the first wiring layer and connected to the contact hole 30, the first resistance Rhu is used as the resistance of the contact hole 30. When calculating the resistance of a wiring path that involves wires 21 and 22 formed on the second wiring layer and connected to the contact hole 30, the second resistance Rhe is used as the resistance of the contact hole 30. When calculating the resistance of a wiring path that involves the wires 11 and 22, or 12 and 21 formed on the first and second wiring layers and connected to the contact hole 30, the sum of the resistances Rhu, Rhe, and Rcn is used as the resistance of the contact hole 30.

In this way, for a semiconductor circuit having wiring layers and contact holes that connect wires formed on the wiring layers to each other, the first aspect of the present invention provides a method of calculating the resistance of a given wiring path which involves a contact hole and wires connected thereto, of the semiconductor circuit. This is done by calculating the resistances of the contact hole and the wires of the wiring path and by summing up the calculated resistances. The method includes a step of dividing the resistance of the contact hole into a first resistance in contact with a first wiring layer, a second resistance in contact with a second wiring layer, and an interlayer resistance. The method further includes the step of using, as the resistance of the contact hole when calculating the resistance of the wiring path, the first resistance when the wires of the wiring path are on the first wiring layer, the second resistance when the wires of the wiring path are on the second wiring layer, and the sum of the first, second, and interlayer resistances when the wires of the wiring path are on the first and second wiring layers.

The first aspect of the present invention also provides a CAD system for designing a semiconductor circuit having wiring layers and contact holes that connect wires formed on the wiring layers to each other. The CAD system has a block (i.e., a block of software code or code block) for calculating and storing the resistances of the contact hole and the wires which are connected to the contact hole to form a wiring path. A summation block sums up the calculated resistances, to provide the resistance of the wiring path. A calculation-storage block calculates and stores, as the resistance of the contact hole, a first resistance in contact with a first wiring layer, a second resistance in contact with a second wiring layer, an interlayer resistance, and a combination of the above resistances. The summation block uses, as the resistance of the contact hole, the first resistance when the wires of the wiring path are on the first wiring layer, the second resistance when the wires of the wiring path are on the second wiring layer, and the sum of the first, second, and interlayer resistances when the wires of the wiring path are on the first and second wiring layers, and calculates the resistance of the wiring path.

In the second aspect of the present invention illustrated in FIG. 1B, the resistance of a contact hole 60 is divided into a first resistance in contact with a first wiring layer, a second resistance in contact with a second wiring layer, and an interlayer resistance. The second aspect halves the first resistance into resistances Rhua and Rhub of contact layers 61 and 62, respectively, and the second resistance into resistances Rhlc and Rhld of contact layers 63 and 64, respectively. Resistances Rcu and Rcl of contact layers 66 and 67, respectively, are provided at both sides of the interlayer resistance Rcn of contact layer 65. Rhua, Rhub and Rcu are each respectively half of the first resistance Rhu in FIG. 1A. Rhlc, Rhld and Rcl are each respectively half of the second resistance Rhl in FIG. 1A. A modified resistance of each wire 41, 42 that is on the first wiring layer and is connected to contact hole 60 may be calculated as the sum of its own resistance and half of the first resistance of the contact hole (Rhua or Rhub). A modified resistance of each wire 51, 52 that is on the second wiring layer and is connected to contact hole 60 may be calculated as the sum of its own resistance and half of the second resistance of the contact hole 60 (Rhlc or Rhld). A modified resistance of each contact hole 60 may be calculated as the sum of the interlayer resistance (Rcn), half of the first resistance (Rcu) and half of the second resistance (Rcl). The resistance of a wiring path is calculated by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second layers.

The second aspect of the present invention further improves the CAD system according to the first aspect. In the CAD system according to the second aspect, the calculation-storage block can calculate and store a modified resistance of each wire that is on the first wiring layer and is connected to a contact hole 60 as the sum of the resistance of the wire and half of the first resistance of the contact hole 60. The calculation-storage block can calculate and store a modified resistance of each wire that is on the second wiring layer and is connected to a contact hole 60 as the sum of its own resistance and half of the second resistance of the contact hole. The calculation-storage block can calculate and store a modified resistance of each contact hole 60 as the sum of the interlayer resistance, half of the first resistance and half of the second resistance Then, the summation block 272 calculates the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole 60 forming the wiring path when the wires are on the first and second wiring layers.

The first aspect of the present invention divides the resistance of the contact hole 30 (FIG. 1A) into the resistance Rhu of the first contact layer 31, the resistance Rhl of the second contact layer 32, and the resistance Rcn of the intermediate contact layer 33. When wires of a given wiring path connected to the contact hole 30 are on the same wiring layer, the resistance Rcn of the intermediate contact layer is not added when calculating the resistance of the path, thereby improving the accuracy of the calculated resistance of the wiring path.

Further, according to the second aspect of the present invention, the results of the resistance calculations coincide with those obtained according to the first aspect, and the calculation processes can be simplified because only resistances of the wires are summed up when the wires are on the same layer.

Figure 2A:
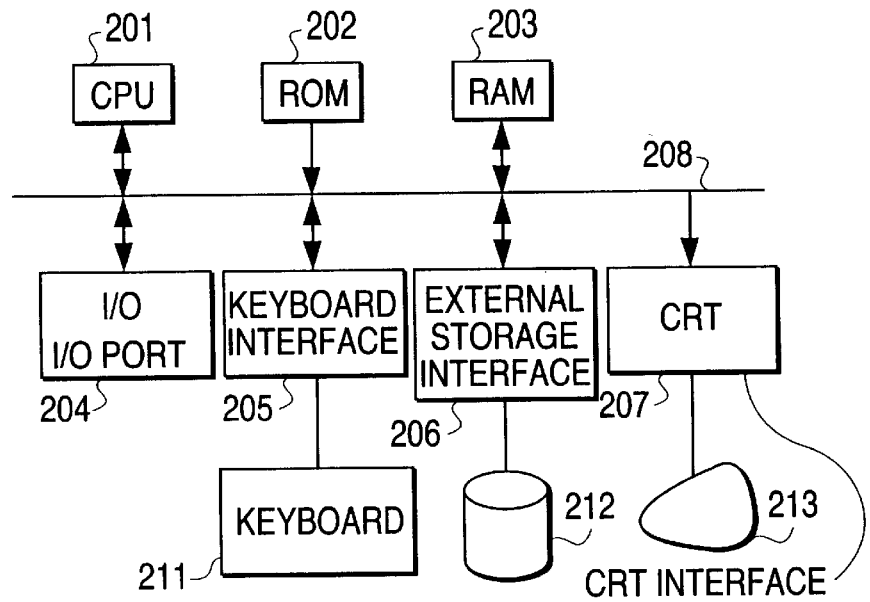
FIGS. 2A and 2B are block diagrams of a CAD system according to an embodiment of the present invention.
Figure 2B:
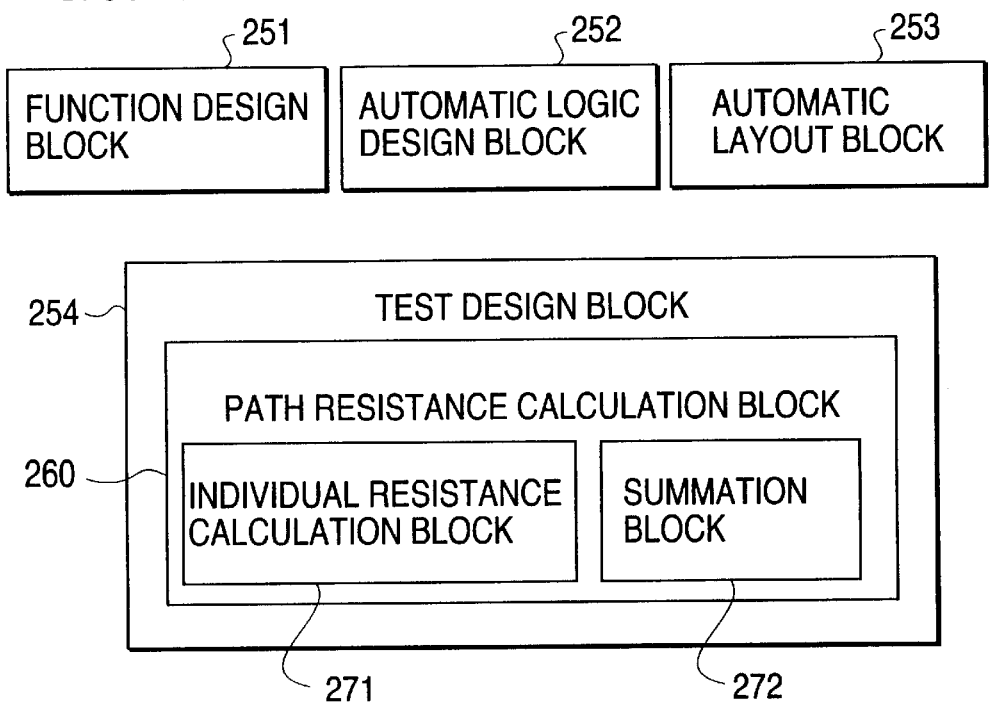

FIG. 2A is a block diagram of a hardware arrangement of a CAD system for designing a semiconductor circuit according to an embodiment of the present invention, and FIG. 2B is a diagram of functional blocks (i.e., software blocks) of the CAD system.

The hardware arrangement of the CAD system is the same as that of a usual computer and includes a CPU 201, a ROM 202, a RAM 203, an I/O port 204, a keyboard interface 205, an external storage interface 206, a CRT interface 207, a bus 208, a keyboard 211, a magnetic disk unit 212 and a CRT 213. This kind of hardware arrangement is well known, and therefore, will not be explained in detail here.

The functions of the CAD system are realized by software which is illustrated in FIG. 2B. In FIG. 2B, the CAD system has a function design block 251, an automatic logic design block 252, an automatic layout block 253 and a test design block 254. There are other functional blocks that are not directly related to the present invention and are not explained here.

The test design block 254 has a path resistance calculation block 260 for calculating the resistance of a given wiring path. The block 260 includes an individual resistance calculation block 271 and a summation block 272. The block 271 calculates and stores the resistance of each of the wires and contact holes that form a wiring path. The block 272 sums up the resistances of the wires and contact holes forming the wiring path and provides the resistance of the wiring path.

Figure 3:
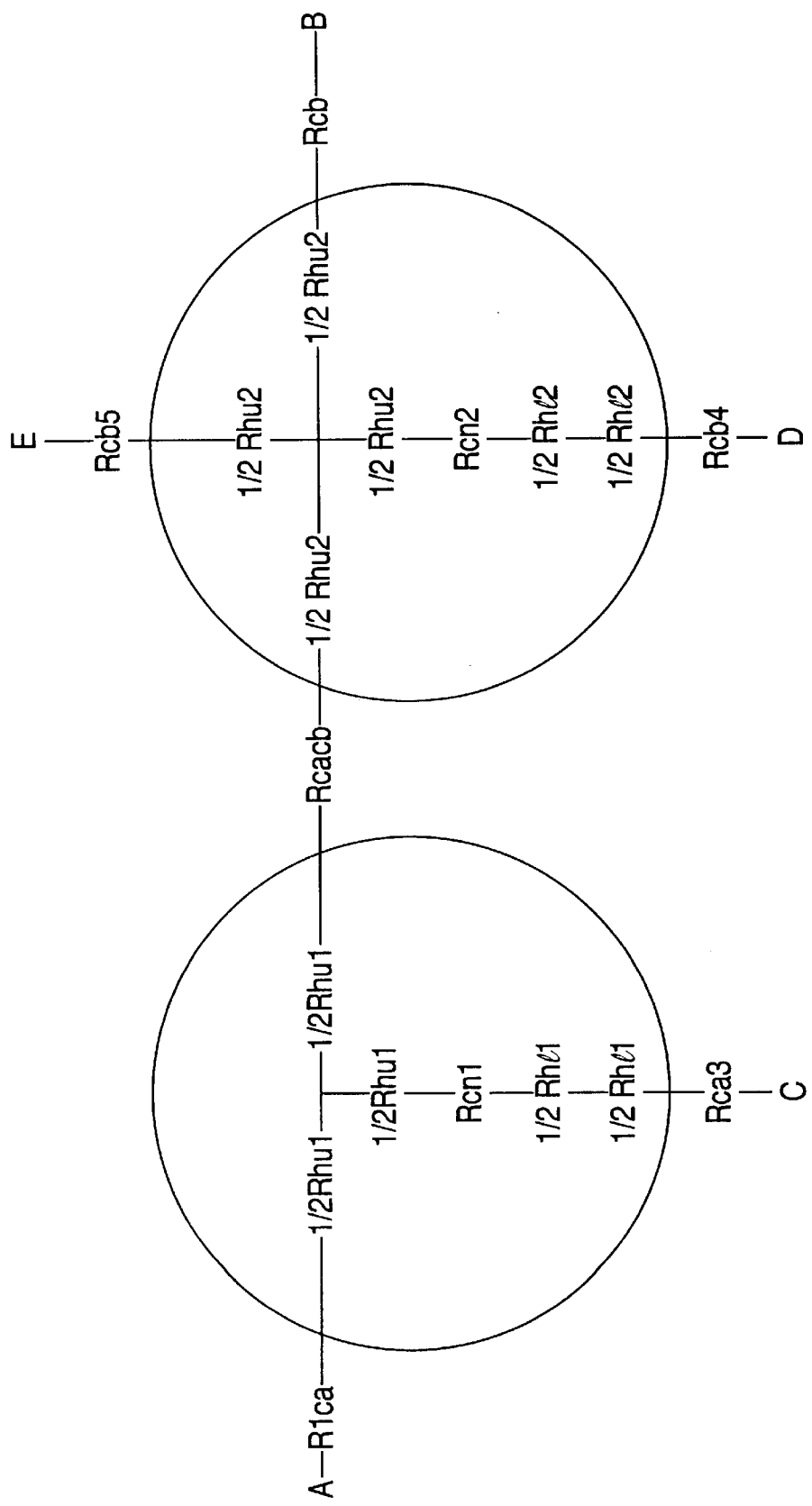
FIG. 3 is a diagram illustrating a resistance distribution according to the embodiment of FIGS. 2A and 2B.
Figure 6:
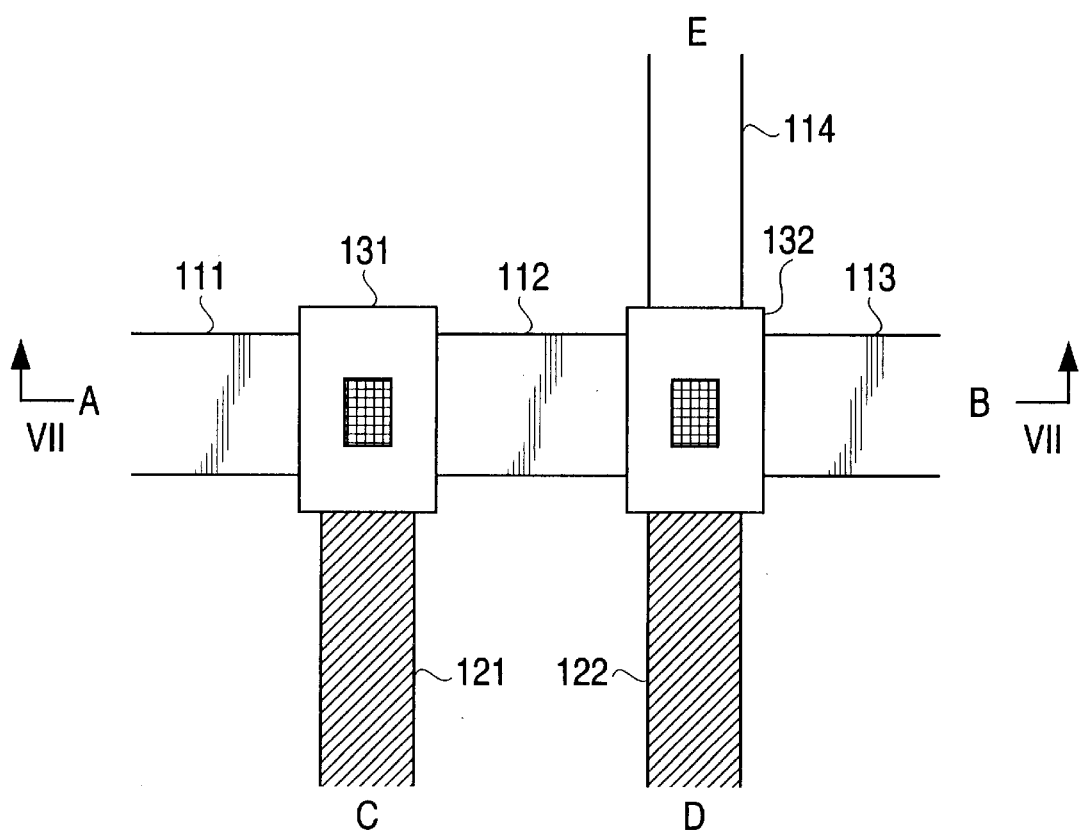
FIG. 6 is a diagram illustrating a layout for a wiring path whose resistances are to be calculated.
Figure 7A:
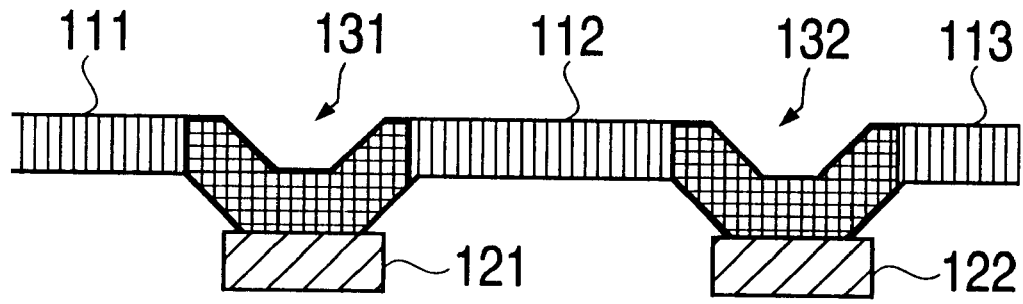
FIGS. 7A and 7B are diagrams illustrating a model for calculating resistance in accordance with the prior art.
Figure 7B:
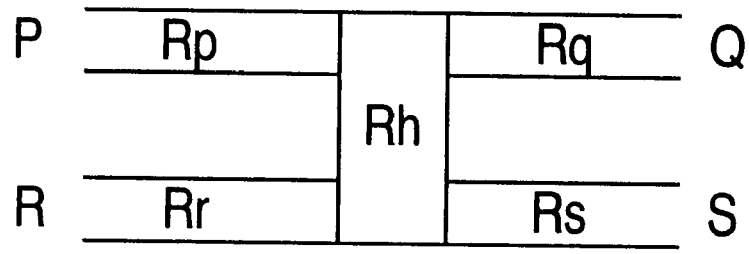
Figure 8:
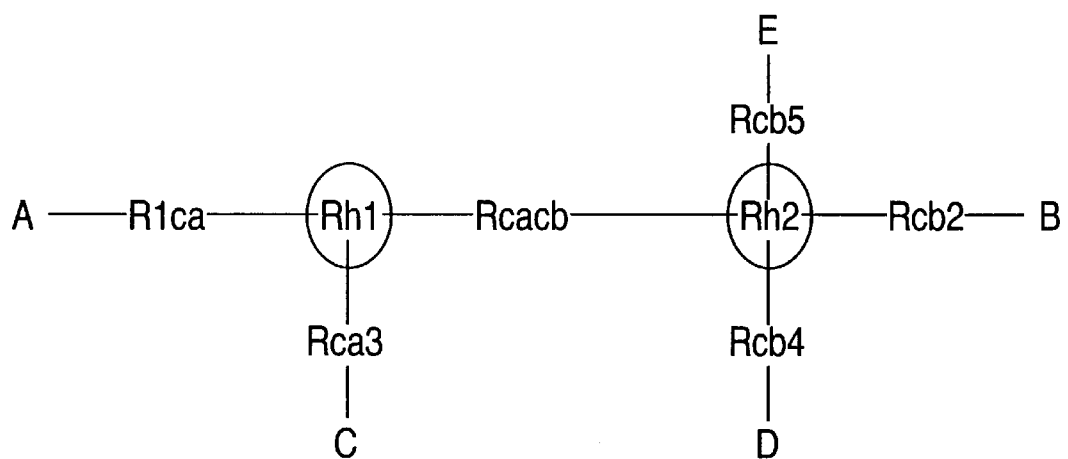
FIG. 8 is a diagram illustrating a resistance distribution for the layout of FIG. 6 in accordance with the prior art.

FIG. 3 is a diagram illustrating the distribution and connection of resistances modeled according to the present invention based on the layout of FIG. 6. The metal wires 111, 112, 113, and 114 formed on the upper wiring layer have resistances R1ca, Rcacb, Rcb, and Rcb5, respectively. The metal wires 121 and 122 formed on the lower wiring layer have resistances Rca3 and Rcb4, respectively. Unlike the prior art of FIG. 8 that represents the resistances of the contact holes 131 and 132 with Rh1 and Rh2, respectively, the embodiment of FIG. 3 divides the resistance of the contact hole 131 into the resistance of an upper contact layer, the resistance of a lower contact layer, and the resistance of an intermediate contact layer. Half of the resistance of the upper contact layer (i.e., 1/2Rhu1) is added to the resistance of each of the wires 111 and 112 that are formed on the upper wiring layer and connected to the contact hole 131. Similarly, half of the resistance of the lower contact layer (i.e., 1/2Rhl1) is added to the resistance of the wire 121 that is formed on the lower wiring layer and connected to the contact hole 131. The interlayer resistance of the contact hole 131 is 1/2Rhu1+Rcn1+1/2Rhl1. The resistance of the contact hole 132 is divided into the resistance of an upper contact layer, the resistance of a lower contact layer, and the resistance of an intermediate contact layer. Half of the resistance of the upper contact layer, i.e., 1/2Rhu2 is added to the resistance of each of the wires 112, 113, and 114 that are formed on the upper wiring layer and connected to the contact hole 132. Similarly, half of the resistance of the lower contact layer, i.e., 1/2Rhl2 is added to the resistance of the wire 122 that is formed on the lower wiring layer and connected to the contact hole 132. The interlayer resistance of the contact hole 132 is 1/2Rhu2+Rcn2+1/2Rhl2. The contact hole 131 is connected to the two wires 111 and 112 that are formed on the upper wiring layer, and therefore, each of the wires 111 and 112 has a resistance which includes 1/2Rhu1. The contact hole 132 is connected to the three wires 112, 113 and 114 that are formed on the upper wiring layer, and therefore, each of the wires 112, 113 and 114 has a resistance which includes 1/2Rhu2. Each of the contact holes 131 and 132 is connected to one wire (121, 122) that is formed on the lower wiring layer, and therefore, the wires 121 and 122 have resistances which include 1/2Rhl1 and 1/2Rhl2, respectively. The resistances Rhu1, Rhl1, Rcn1, Rhu2, Rhl2, and Rcn2 of FIG. 3 and the resistances Rh1 and Rh2 of FIG. 8 have the following relationship:

$$Rh1 = Rhu1 + Rcn1 + Rhl1$$

$$Rh2 = Rhu2 + Rcn2 + Rhl2$$

Figure 4:
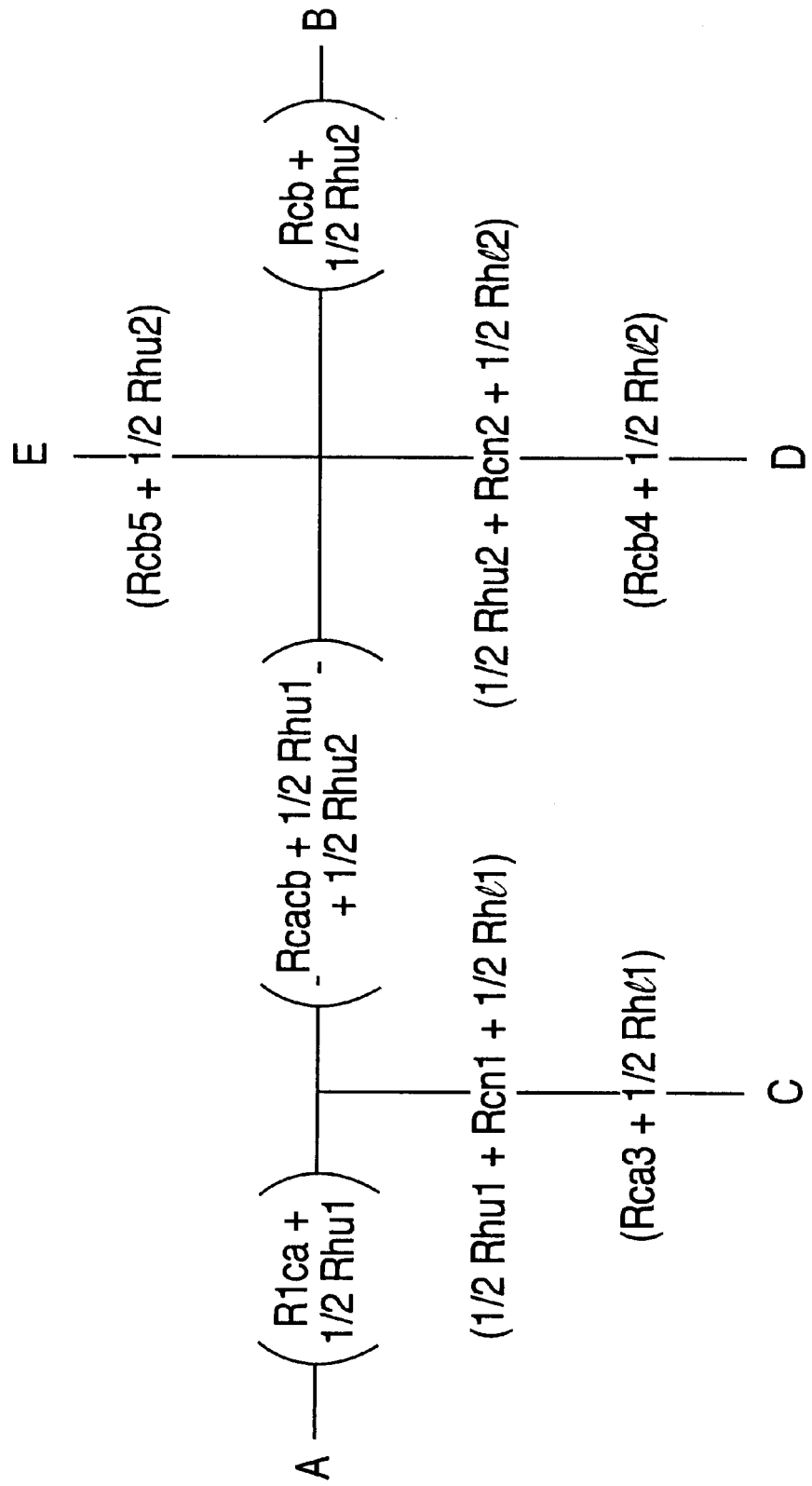
FIG. 4 is a diagram illustrating a stored state of resistances in accordance with the present invention.

FIG. 4 is a diagram of stored data for the resistances of FIG. 3. The stored resistance of the wire 111 is R1ca+1/2Rhu1, that of the wire 112 is Rcacb+1/2Rhu1+1/2Rhu2, that of the wire 113 is Rcb+1/2Rhu2, that of the wire 114 is Rcb5+1/2Rhu2, that of the wire 121 is Rca3+1/2Rhl1, and that of the wire 122 is Rcb4+1/2Rhl2. The resistance of the contact hole 131 is stored as 1/2Rhu1+Rcn1+1/2Rhl1, and that of the contact hole 132 is 1/2Rhu2+Rcn2+1/2Rhl2.

The resistance of each wiring path of FIG. 6, as calculated according to the stored resistances illustrated in FIG. 4, is as follows:

$$A \text{ to } C = (R1ca + 1/2Rhu1) + (1/2Rhu1 + Rcn1 + 1/2Rhl1) +$$
$$(1/2Rhl1 + Rca3)$$
$$= R1ca + Rhu1 + Rcn1 + Rhl1 + Rca3$$
$$A \text{ to } D = (R1ca + 1/2Rhu1) + (1/2Rhu1 + Rcacb + 1/2Rhu2) +$$
$$(1/2Rhu2 + Rcn2 + 1/2Rhl2) + (1/2Rhl2 + Rcb4)$$
$$= R1ca + Rhu1 + Rcacb + Rhu2 + Rcn2 + Rhl2 + Rcb4$$

$$A \text{ to } E = (R1ca + 1/2Rhu1) + (1/2Rhu1 + Rcacb + 1/2Rhu2) +$$
$$(1/2Rhu2 + Rcb5)$$
$$= R1ca + Rhu1 + Rcacb + Rhu2 + Rcb5$$
$$A \text{ to } B = (R1ca + 1/2Rhu1) + (1/2Rhu1 + Rcacb + 1/2Rhu2) +$$
$$(1/2Rhu2 + Rcb2)$$
$$= R1ca + Rhu1 + Rcacb + Rhu2 + Rcb2$$

Since the resistances Rhu1, Rhl1, Rcn1, Rhu2, Rhl2, and Rcn2 have the relationship mentioned above with respect to the resistances Rh1 and Rh2, the resistance of the wiring path from A to C and that of the wiring path from A to D are expressed as follows:

$$A \text{ to } C = R1ca + Rh1 + Rca3$$

$$A \text{ to } D = R1ca + Rhu1 + Rcacb + Rh2 + Rcb4$$

Figure 5:
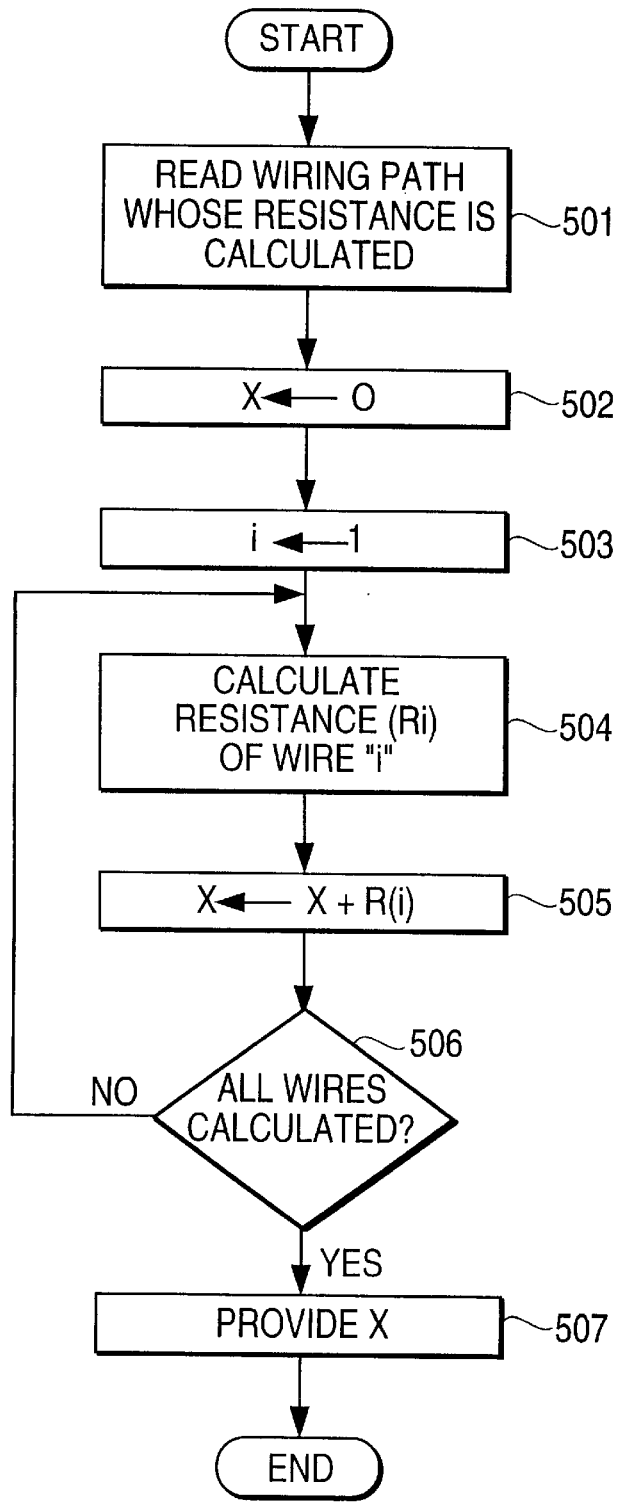
FIG. 5 is a flow chart illustrating the operation of the CAD system of FIGS. 2A and 2B.

FIG. 5 is a flow chart showing the operation of the present invention for calculating the resistance of a wiring path. In step 501 a wiring path whose resistance is going to be calculated, is read. In step 502 a register X that stores the sum of resistances, is set to zero. In step 503 a register i is set to "1." In step 504 a resistance R(i) of a wire "i" contained in the wiring path, is calculated. Here, a contact hole is handled as a wire. In step 505 the calculated resistance R(i) is added to the contents of register X. In step 506 it is determined whether or not the resistance of every wire forming the wiring path has been calculated. Until the decision in step 506 is YES, steps 504 to 506 are repeated. When the decision in step 506 is YES, then in step 507 the value in the register X is determined to be the resistance of the wiring path.

As explained above, there is only one wiring path whose resistance is going to be calculated, even if a contact hole contained in the wiring path involves a plurality of branches. Namely, even if a contact hole of a given wiring path whose resistance is going to be calculated involves many wires connected thereto, the wiring path involves only one wire that enters the contact hole and only one wire that exits from the contact hole. Accordingly, the present invention adds half of the resistance of an upper contact layer of a contact hole to each wire that is in contact with the upper contact layer, and half of the resistance of a lower contact layer of the contact hole to each wire that is in contact with the lower contact layer. Then, no unnecessary resistance of the contact hole will be added when calculating the resistance of a wiring path that includes the contact hole.

The half of the resistance of the upper contact layer of the contact hole which is added to a wire on the upper wiring layer, and the half of the resistance of the lower contact layer of the contact hole which is added to a wire on the lower wiring layer, are each considered as part of the resistance of the corresponding wire. This results in reducing the elements necessary for a route search operation and simplifying a route search algorithm.

Although the above explanation has been provided for calculating the resistance of a wiring path extending on an upper wiring layer through a contact hole and a wiring path extending from an upper wiring layer to a lower wiring layer through a contact hole, the present invention is also applicable to a wiring path extending on a lower wiring layer through a contact hole and a wiring path extending from a lower wiring layer to an upper wiring layer through a contact hole, and to a contact hole involving many branches.

As explained above, the present invention is capable of accurately calculating the resistance of a wiring path of a semiconductor circuit and of improving the reliability of simulations carried out by a CAD system.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to as falling within the scope of the invention in the appended claims and their equivalents.

What is claimed is:

1. A method of calculating a resistance of a selected wiring path in a semiconductor circuit having wiring layers and contact holes that connect wires formed on the wiring layers to each other, comprising the steps of:

dividing a resistance of a contact hole into a first resistance in contact with a first wiring layer, a second resistance in contact with a second wiring layer, and an interlayer resistance; and calculating a resistance of a selected wiring path using, as the resistance of the contact hole, the first resistance when the wires of the selected wiring path are on the first wiring layer, the second resistance when the wires of the selected wiring path are on the second wiring layer, and the sum of the first, second and interlayer resistances when the wires of the selected wiring path are on the first and second wiring layers.

2. The method according to claim 1, wherein said calculating step further includes:

calculating a modified resistance of each wire that is on the first wiring layer and is connected to a contact hole to be the sum of its own resistance and half of the first resistance of the contact hole;

calculating a modified resistance of each wire that is on the second wiring layer and is connected to a contact hole to be the sum of its own resistance and half of the second resistance of the contact hole;

calculating a modified resistance of each contact hole to be the sum of the interlayer resistance, half of the first resistance and half of the second resistance; and calculating the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

3. A CAD system for designing a semiconductor circuit having wiring layers and contact holes that connect wires formed on the wiring layers to each other, comprising:

first means for calculating and storing the resistance of each contact hole and wire, which are connected to form a wiring path; and second means for summing up the calculated resistances and to output the resistance of the wiring path, said first means calculating and storing, as the resistance of the contact hole, a first resistance in contact with a first wiring layer, a second resistance in contact with a second wiring layer, an interlayer resistance, and a combination of the first, second and interlayer resistances, said second means calculating the resistance of the wiring path using, as the resistance of the contact hole, the first resistance when the wires of the wiring path are on the first wiring layer, the second resistance when the wires of the wiring path are on the second wiring layer, and the sum of the first, second and interlayer resistances when the wires of the wiring path are on the first and second wiring layers.

4. The CAD system according to claim 3, wherein:

said first means calculates and stores a modified resistance of each wire that is on the first wiring layer and is connected to a contact hole as the sum of its own resistance and half of the first resistance of the contact hole, and said first means calculates and stores a modified resistance of each wire that is on the second wiring layer and is connected to a contact hole as the sum of its own resistance and half of the second resistance of the contact hole, and said first means calculates and stores a modified resistance of each contact hole as the sum of the interlayer resistance, half of the first resistance and half of the second resistance; and said second means calculates the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

5. A method of calculating a resistance of a wiring path in a semiconductor circuit, using a computer, comprising:

storing at least first, second and third resistance values corresponding to at least first, second and third portions of a contact hole, the first portion being in contact with a first layer, the second portion being in contact with a second layer and the third portion being an interlayer between the first and second portions; and calculating a resistance of a selected wiring path including the contact hole, by selecting as a resistance value for the contact hole, one of the first resistance value, the second resistance value, and a combination of the first, second, and third resistance values, depending upon the route of the wiring path through the contact hole.

6. A method according to claim 5, wherein the first and second layers comprise first and second wiring layers, respectively, and wherein said storing comprises dividing the resistances of the contact hole so that the first resistance value corresponds to the first portion of the contact hole which is in contact with the first wiring layer, so that the second resistance value corresponds to the second portion of the contact hole which is in contact with the second wiring layer, and so that the third resistance value corresponds to the third portion of the contact hole which is between the first and second portions.

7. A method according to claim 6, wherein said calculating includes using, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

8. A method according to claim 5, wherein the first and second layers comprise first and second wiring layers, respectively, and wherein said calculating includes using, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

9. A method according to claim 8, wherein said calculating further includes:

calculating a modified resistance of each wire that is on the first wiring layer and is connected to a contact hole to be the sum of its own resistance and half of the first resistance of the contact hole;

calculating a modified resistance of each wire that is on the second wiring layer and is connected to a contact hole to be the sum of its own resistance and half of the second resistance of the contact hole;

calculating a modified resistance of each contact hole to be the sum of an interlayer resistance, half of the first resistance and half of the second resistance; and calculating the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

10. A CAD system for calculating a resistance of a wiring path in a semiconductor circuit, comprising:

a memory to store at least first, second and third resistance values corresponding to at least first, second and third portions of a contact hole, the first portion being in contact with a first layer, the second portion being in contact with a second layer, and the third portion being an interlayer between the first and second portions; and a processor to calculate a resistance of the wiring path through the contact hole, by selecting as a resistance value for the contact hole, one of the first resistance value, the second resistance value, and a combination of the first, second and third resistance values, depending upon the route of the wiring path through the contact hole.

11. A CAD system according to claim 10, wherein the first and second layers comprise first and second wiring layers, respectively, and wherein the first, second and third resistance values stored in said memory are such that the first resistance value corresponds to the first portion of the contact hole which is in contact with the first wiring layer, the second resistance value corresponds to the second portion of the contact hole which is in contact with the second wiring layer, and the third resistance value corresponds to the third portion of the contact hole which is between the first and second portions of the contact hole.

12. A CAD system according to claim 11, wherein said processor uses, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

13. A CAD system according to claim 10, wherein the first and second layers comprise first and second wiring layers, respectively, and wherein said processor uses, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

14. A CAD system according to claim 13, wherein said processor:

calculates a modified resistance of each wire that is on the first wiring layer and is connected to a contact hole, to be the sum of its own resistance and half of the first resistance of the contact hole;

calculates a modified resistance of each wire that is on the second wiring layer and is connected to a contact hole, to be the sum of its own resistance and half of the second resistance of the contact hole;

calculates a modified resistance of each contact hole to be the sum of an interlayer resistance, half of the first resistance and half of the second resistance; and calculates the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and contact hole forming the wiring path when the wires are on the first and second wiring layers.

15. A computer readable storage including a process controlling a computer, comprising:

storing at least first, second and third resistance values corresponding to at least first, second and third portions of a contact hole, the first portion being in contact with a first layer, the second portion being in contact with a second layer, and the third portion being an interlayer between the first and second portions; and calculating a resistance of a selected wiring path through the contact hole, by selecting as a resistance value for the contact hole, one of the first resistance value, the second resistance value, or a combination of the first, second, and third resistance values, depending upon the route of the wiring path with respect to the contact hole.

16. The computer readable storage according to claim 15, wherein the first and second layers comprise first and second wiring layers, respectively, and wherein said storing process comprises a process dividing the resistances of the contact hole, so that the first resistance value corresponds to the first portion of the contact hole which is in contact with the first wiring layer, so that the second resistance value corresponds to the second portion of the contact hole which is in contact with the second wiring layer, and so that the third resistance value corresponds to the third portion of the contact hole which is between the first and second portions.

17. The computer readable storage according to claim 16, wherein said calculating process includes using, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

18. The computer readable storage according to claim 15, wherein the first and second layers comprise first and second wiring layers, respectively, and wherein said calculating process includes using, as the resistance of the contact hole, the first resistance value when the wires of the selected wiring path are on the first wiring layer, the second resistance value when the wires of the selected wiring path are on the second wiring layer, and the sum of the first, second and third resistance values when the wires of the selected wiring path are on the first and second wiring layers.

19. The computer readable storage according to claim 18, wherein said calculating process further includes:
- a process calculating the modified resistance of each wire that is on the first wiring layer and is connected to a contact hole, to be the sum of its own resistance and half of the first resistance of the contact hole;
- a process calculating a modified resistance of each wire that is on the second wiring layer and is connected to a contact hole, to be the sum of its own resistance and half of the second resistance of the contact hole;
- a process calculating a modified resistance of each contact hole to be the sum of an interlayer resistance, half of the first resistance and half of the second resistance; and
- a process calculating the resistance of the wiring path by summing up the resistances of the wires forming the wiring path when the wires are on the first wiring layer, by summing up the resistances of the wires forming the wiring path when the wires are on the second wiring layer, and by summing up the resistances of the wires and the contact hole forming the wiring path when the wires are on the first and second wiring layers.

* * * * *